(12) United States Patent
Shintate et al.

(10) Patent No.: US 7,972,651 B2
(45) Date of Patent: Jul. 5, 2011

(54) METHOD FOR FORMING MULTI-LAYERED STRUCTURE, METHOD FOR MANUFACTURING WIRING SUBSTRATE, AND METHOD FOR MANUFACTURING ELECTRONIC APPARATUS

(75) Inventors: Tsuyoshi Shintate, Matsuyama-machi (JP); Kazuaki Sakurada, Suwa (JP); Jun Yamada, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1336 days.

(21) Appl. No.: 11/196,677

(22) Filed: Aug. 4, 2005

(65) Prior Publication Data
US 2006/0060944 A1 Mar. 23, 2006

(30) Foreign Application Priority Data
Sep. 22, 2004 (JP) ................. 2004-274621

(51) Int. Cl.
*H01L 29/06* (2006.01)
(52) U.S. Cl. ..................................... 427/97.1
(58) Field of Classification Search .............. 428/901; 427/96.1, 299, 466, 68, 64
See application file for complete search history.

(56) References Cited

U.S. PATENT DOCUMENTS

| | | | |
|---|---|---|---|
| 6,184,959 B1 * | 2/2001 | Izumi | 349/124 |
| 6,337,222 B1 * | 1/2002 | Shimoda et al. | 438/29 |
| 2003/0001992 A1 * | 1/2003 | Kawase et al. | 349/106 |
| 2003/0213614 A1 | 11/2003 | Furusawa et al. | |
| 2003/0232128 A1 * | 12/2003 | Furusawa et al. | 427/58 |
| 2004/0001961 A1 * | 1/2004 | Ono et al. | 428/500 |
| 2004/0155582 A1 * | 8/2004 | Yoshihara et al. | 313/582 |
| 2004/0247889 A1 * | 12/2004 | Nakajima et al. | 428/423.1 |
| 2005/0026419 A1 * | 2/2005 | Yudasaka et al. | 438/620 |

FOREIGN PATENT DOCUMENTS

| | | |
|---|---|---|
| JP | A-2000-158639 | 6/2000 |
| JP | A-2003-311196 | 11/2003 |
| JP | A-2004-006578 | 1/2004 |
| JP | A-2004-055965 | 2/2004 |

* cited by examiner

*Primary Examiner* — Michael Cleveland
*Assistant Examiner* — Tabassom Tadayyon Eslami
(74) *Attorney, Agent, or Firm* — Oliff & Berridge, PLC

(57) ABSTRACT

A method for forming a multi-layered structure using a droplet-discharging device; the method comprises: (A) forming a first insulating-material layer covering the material-body surface by discharging a droplet of a first insulating material including a first photosensitive resin to a material-body surface; (B) obtaining a first insulating layer by curing in the first insulating-material layer; (C) forming a pattern of an electric conductive material layer on the first insulating layer by discharging a droplet of an electric conductive material to the first insulating layer; and (D) forming a wiring pattern on the first insulating layer by activating the pattern of the electric conductive material layer.

8 Claims, 8 Drawing Sheets

METHOD FOR FORMING MULTI-LAYERED STRUCTURE, METHOD FOR MANUFACTURING WIRING SUBSTRATE, AND METHOD FOR MANUFACTURING ELECTRONIC APPARATUS

This nonprovisional application claims the benefit of Japanese Application No. 2004-274621, filed Sep. 22, 2004. The entire disclosure of the prior application is hereby incorporated by reference herein in its entirety.

BACKGROUND OF THE INVENTION

1. Technical Field

The present invention relates to a method for forming a multi-layered structure using a droplet-discharging device, and in particular relates to the method for forming a multi-layered structure suitable for manufacturing wiring substrates and for manufacturing an electronic apparatus.

2. Related Art

The method for manufacturing wiring substrates and circuit boards using an additive process based on the printing method is attracting attention. This is because the cost of the additive process is lower as compared with the methods for repeating an application process and a photo lithography process of thin films to thereby manufacture the wiring substrates and circuit boards.

As one of the arts used in such an additive process, an electric conductive pattern formation technique with an ink-jet method is known.

Japanese Unexamined Patent Publication No. 2004-6578 is an example of the related art.

In the case where a droplet of a resin material or an electric conductive material is prepared to thereby provide an insulating layer and a wiring pattern thereon using the ink-jet method, disconnection may occur in the wiring pattern.

SUMMARY

An advantage of the invention is to form a stable multi-layered structure using the ink-jet method.

According to a first aspect of the invention, the method for forming a multi-layered structure uses a droplet-discharging device and includes: a step (A) in which a droplet of a first insulating material including a first photosensitive resin is discharged to a material-body surface, thereby forming a first insulating-material layer covering the material-body surface; a step (B) in which the first insulating-material layer is cured, thereby obtaining a first insulating layer; a step (C) in which a droplet of an electric conductive material is discharged to the first insulating layer, thereby forming a pattern of an electric conductive material layer on the first insulating layer; and a step (D) in which the pattern of the electric conductive material layer is activated, thereby forming a wiring pattern on the first insulating layer.

One of the advantages obtained by the configuration described above is that disconnection of the wiring pattern will not occur since the wiring pattern is formed after the first insulating-material layer has been cured.

It is preferable that the method for forming a multi-layered structure further include: a step (E) for making the surface of the first insulating layer lyophilic; a step (F) in which a droplet of a second insulating material including a second photosensitive resin is discharged to the first insulating layer and the electric conductive layer, thereby forming a second insulating-material layer covering the first insulating layer and the electric conductive layer; and a step (G) for curing the second insulating-material layer.

According to the configuration described above, since the surface of the first insulating layer is made lyophilic, the second insulating layer whose surface is flat can be formed across on the first insulating layer.

It is also preferable that the step (B) include a step of irradiating light with a first wavelength to the first insulating-material layer, thereby curing the first insulating-material layer; and the step (E) include a step of irradiating light with a second wavelength different from the first wavelength onto the surface of the first insulating layer, thereby making the surface of the first insulating layer lyophilic.

One of the advantages obtained by the configuration described above is that it is possible to achieve curing of the first insulating-material layer, and making the first insulating layer lyophilic only with the steps including the light irradiation.

According to a second aspect of the invention, the method for forming a multi-layered structure uses a droplet-discharging device and includes: a step (A) in which a droplet of a first insulating material including a first photosensitive resin is discharged to a material-body surface, thereby forming a first insulating-material layer covering the material-body surface; a step (B) in which the first insulating-material layer is cured, thereby obtaining the first insulating layer, a step (C) for making the surface of the first insulating layer lyophilic; a step (D) in which a droplet of a second insulating material including a second photosensitive resin is discharged to the first insulating layer, thereby forming a second insulating-material layer covering the first insulating layer; and a step (E) for curing the second insulating-material layer.

According to the configuration described above, since the surface of the first insulating layer is made lyophilic, the second insulating layer having a uniform thickness can be formed on the first insulating layer.

It is preferable that the step (B) include a step of irradiating light with a first wavelength to the first insulating-material layer, thereby curing the first insulating-material layer; and the step (C) include a step of irradiating light with a second wavelength different from the first wavelength onto the surface of the first insulating layer, thereby making the surface of the first insulating layer lyophilic.

One of the advantages obtained by the configuration described above is to be able to achieve curing of the first insulating-material layer, and making the first insulating layer lyophilic only with the steps including the light irradiation.

Furthermore, the invention can be realized with various forms. For example, the invention is realized in a form of a method for manufacturing wiring substrates, or a method for manufacturing an electronic apparatus.

BRIEF DESCRIPTION OF THE DRAWINGS

The invention will be described with reference to the accompanying drawings, wherein like numbers reference like elements, and wherein.

DESCRIPTION OF THE EMBODIMENTS

A. Whole Configuration of a Droplet-Discharging Device

The manufacturing equipment of the embodiment includes three droplet-discharging devices. Three droplet-discharging devices are devices for discharging an insulating material 7A (FIG. 1), an electric conductive material 8A, and an insulating material 9A, respectively. In addition, as described later, each of these insulating material 7A, electric conductive material 8A, and insulating-material 9A is a type of liquid materials.

Figure 1:
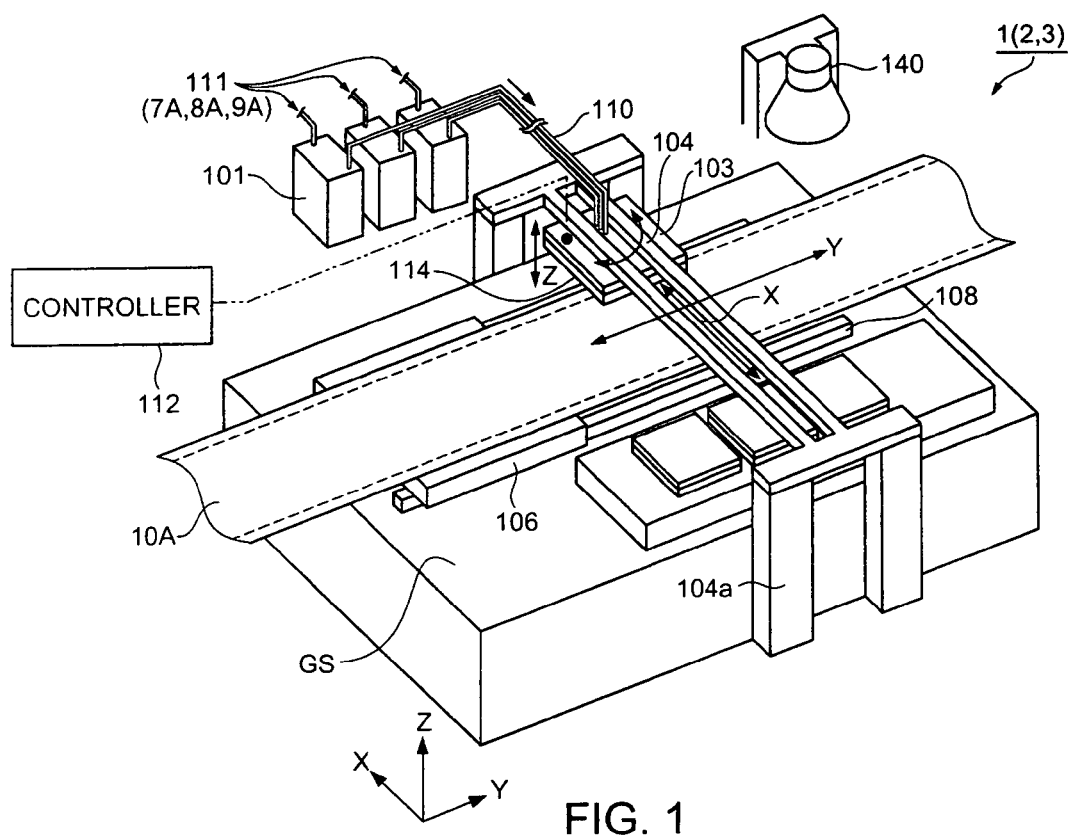
FIG. 1 is a schematic view showing a droplet-discharging device of an embodiment.

The droplet-discharging device 1 shown in FIG. 1 is essentially an ink-jet device. More specifically, the droplet-discharging device 1 is provided with a tank 101 for holding a liquid material 111, a tube 110, a grand stage GS, a discharging-head section 103, a stage 106, a first position controller 104, a second position controller 108, a controller 112, a light irradiation device 140, and a support section 104a. In addition, the structure and function of the other two droplet-discharging devices 2 and 3 are essentially the same as those of the droplet-discharging device 1, and, for this reason, the description of the structure and function of these two droplet-discharging devices 2 and 3 will be omitted.

The discharging-head section 103 is holding a head 114 (FIG. 2). This head 114 discharges a droplet of the liquid material 111 in response to the signals from the controller 112. In addition, the head 114 in the discharging-head section 103 is coupled to the tank 101 via the tube 110, and, for this reason, the liquid material 111 is supplied to the head 114 from the tank 101.

The stage 106 provides a plane for fixing a substrate 10A. Furthermore, the stage 106 also has a function to fix the position of the substrate 10A using a suction force. Here, the substrate 10A is a flexible substrate formed of polyimide, and the shape thereof is a tape-like. Then, the ends of the substrate 10A are being fixed to a pair of reels, which are not shown.

The first position controller 104 is being fixed to a position at a predetermined height from the grand stage GS by means of the support section 104a. This first position controller 104 has a function to move the discharging-head section 103 along the X-axis direction, in the Z-axis direction intersecting with the X-axis direction, in response to the signals from the controller 112. Furthermore, the first position controller 104 also has a function to rotate the discharging-head section 103 around an axis parallel to the Z-axis. Here, in the embodiment, the Z-axis direction is a direction parallel to the perpendicular direction (i.e., in the direction of gravitational acceleration).

The second position controller 108 moves the stage 106 to the Y-axis direction on the grand stage GS in response to the signals from the controller 112. Here, the Y-axis direction is a direction intersecting with the both X-axis direction and Z-axis direction.

The configuration of the first position controller 104 and the configuration of the second position controller 108 having the above functions can be realized using a well-known XY robot that uses a linear motor or a servomotor. For this reason, the description of the detailed configuration thereof will be omitted here. In addition, in the specification, the first position controller 104 and the second position controller 108 will be referred to also as a "robot" or a "scanning portion".

Now, as described above, the discharging-head section 103 is moved to the X-axis direction by the first position controller 104. Then, the substrate 10A is moved to the Y-axis direction together with the stage 106 by the second position controller 108. As the results of these, the relative position of the head 114 to the substrate 10A will be varied. More specifically, with these movements, the discharging-head section 103, the head 114, or a nozzle 118 (FIG. 2) are moved relative to the X-axis direction and Y-axis direction with respect to the substrate 10A, or are scanned relatively, while keeping a predetermined distance to the Z-axis direction. The "relative move" or the "relative scan" means that at least one of the sides in which the liquid material 111 is discharged and in which the discharged material is reached (a discharged portion) is moved relative to the other side.

The controller 112 is configured as to receive a discharging data indicative of the relative position, to which a droplet of the liquid material 111 is supposed to be discharged, from an external information-processing unit. The controller 112 stores the received discharging data into an internal memory device, while controlling the first position controller 104, the second position controller 108, and the head 114 in response to the stored discharging data. In addition, the discharging data is a data for applying the liquid material 111 onto the substrate 10A in a predetermined pattern. In the embodiment, the discharging data has a form of a bit map data.

The droplet-discharging device 1 having the configuration described above moves the nozzle 118 (FIG. 2) of the head 114 relative to the substrate 10A in response to the discharging data, while discharging the liquid material 111 from the nozzle 118 towards the discharged portion. In addition, the relative move of the head 114 by the droplet-discharging device 1 and the discharging of the liquid material 111 from the head 114 may be referred collectively to as an "application scan" or a "discharge scan".

In this specification, a portion to which the droplet of the liquid material 111 is reached will be referred to also as the "discharged portion". Then, a portion in which the reached droplet gets wet and spreads will be referred to also as an "applied portion". Both the "discharged portion" and "applied portion" are also the portions formed by applying a surface-reform treatment to the base material-body in order that the liquid material may exhibit a desired contact angle. However, in the case where the surface of the base material-body exhibits a desired liquid-repellency or a desired lyophilic to the liquid material (namely, the reached liquid material exhibits the desirable contact angle on the surface of the base material-body) without applying the surface-reform treatment, the surface of the base material-body itself may be the "discharged portion" or the "applied portion". In addition, in the specification, the "discharged portion" will be referred to also as a "target" or an "acceptor".

Now, back to FIG. 1, the light irradiation device 140 is a device for irradiating ultraviolet light to the liquid material 111 that has been applied to the substrate 10A. ON/OFF of the irradiation of ultraviolet light of the light irradiation device 140 is also controlled by the controller 112.

In addition, forming layers, films, or patterns with the ink-jet method means forming layers, films, or patterns onto a predetermined material-body using the droplet-discharging devices 1 as described above.

B. Head

Figure 2A:
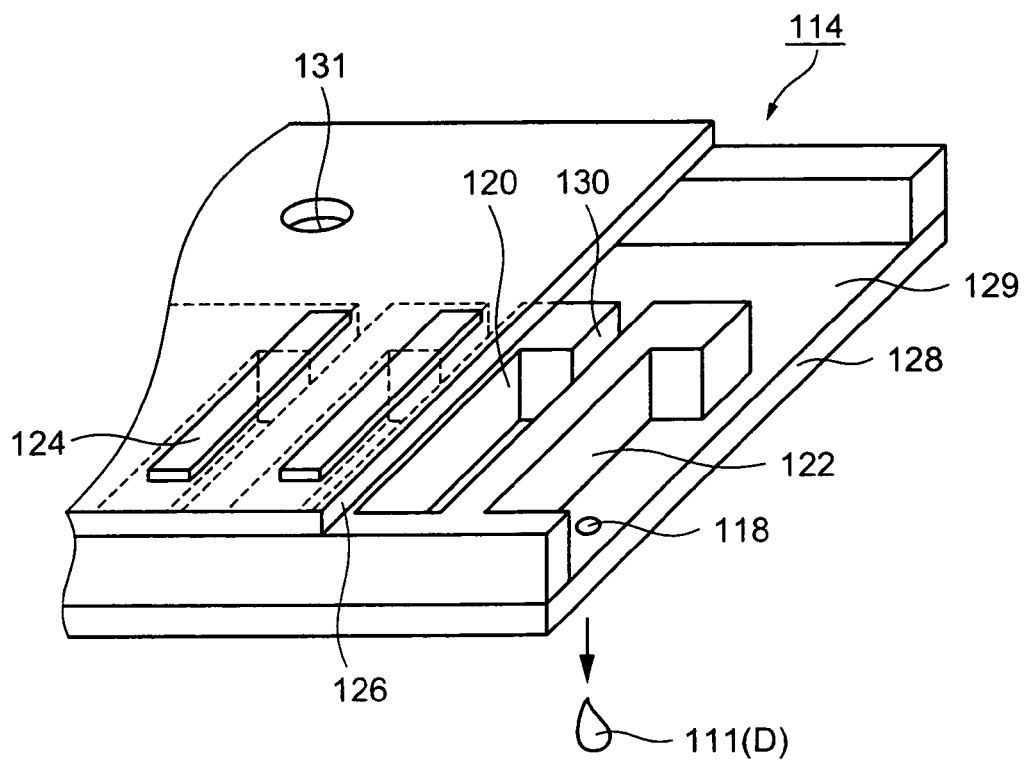
FIG. 2(a) and FIG. 2(b) are schematic views showing a head in the droplet-discharging device.
Figure 2B:
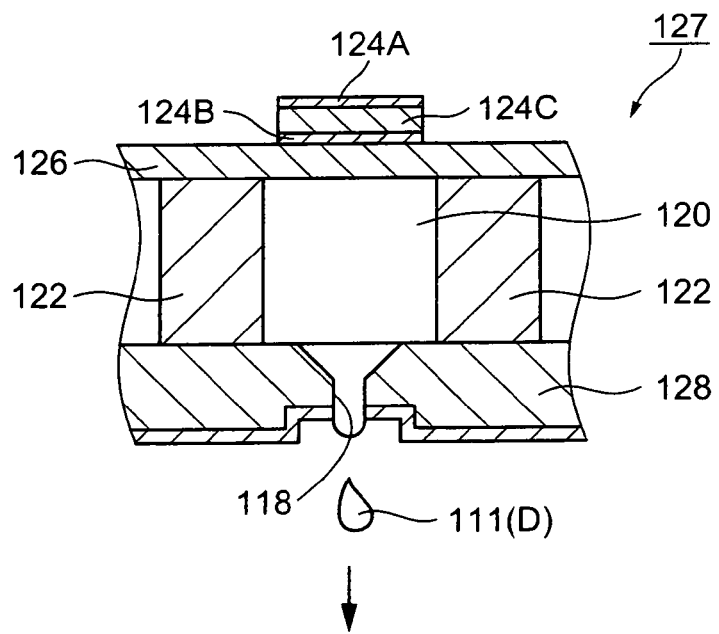

As shown in FIG. 2(a) and FIG. 2(b), the head 114 in the droplet-discharging device 1 is an ink-jet head having a plurality of nozzles 118. Specifically, the head 114 is provided with a diaphragm 126 and a nozzle plate 128 for specifying an opening of the nozzle 118. Then, a liquid bank 129 is positioned in between the diaphragm 126 and the nozzle plate 128, and this liquid bank 129 is always being filled with the liquid material 111 supplied through a hole 131 from an outside tank, which is not shown.

Moreover, a plurality of partitioning walls 122 are positioned in between the diaphragm 126 and the nozzle plate 128. Then, the portion surrounded by the diaphragm 126, the nozzle plate 128, and a pair of partitioning walls 122 is a cavity 120. Since the cavity 120 is provided corresponding to the nozzle 118, the number of cavity 120 and the number of nozzle 118 are identical. The liquid material 111 is supplied to the cavity 120 from the liquid bank 129 through a feed opening 130 positioned in between a pair of partitioning walls 122. In addition, in the embodiment, the diameter of the nozzle 118 is set to approximately 27 μm.

Now, on top of the diaphragm 126, respective vibrators 124 are positioned corresponding to each cavity 120. Each of the vibrators 124 includes a piezo-electric element 124C, and a pair of electrodes 124A and 124B sandwiching the piezo-electric element 124C therebetween. An application of driving voltages to between the pair of electrodes 124A and 124B by the controller 112 allows a droplet D of the liquid material 111 to be discharged from the corresponding nozzle 118. Here, the volume of the material discharged from the nozzle 118 can be varied in the range from 0 pl to 42 pl (pico liter). In addition, the shape of the nozzle 118 is adjusted so that the droplet D of the liquid material 111 may be discharged to the Z-axis direction from the nozzle 118.

In the specification, the portion including one nozzle 118, the cavity 120 corresponding to the nozzle 118, and the vibrator 124 corresponding to the cavity 120 may be referred to as a "discharging portion 127". According to this notation, one head 114 has the discharging portions 127 of the same number as that of the nozzles 118. The discharging portion 127 may have an electric-thermal conversion element in place of the piezo-electric element. That is, the discharging portion 127 may have a configuration in which the material is discharged using a thermal expansion of the material by the electric-thermal conversion element.

C. Controller

Figure 3:
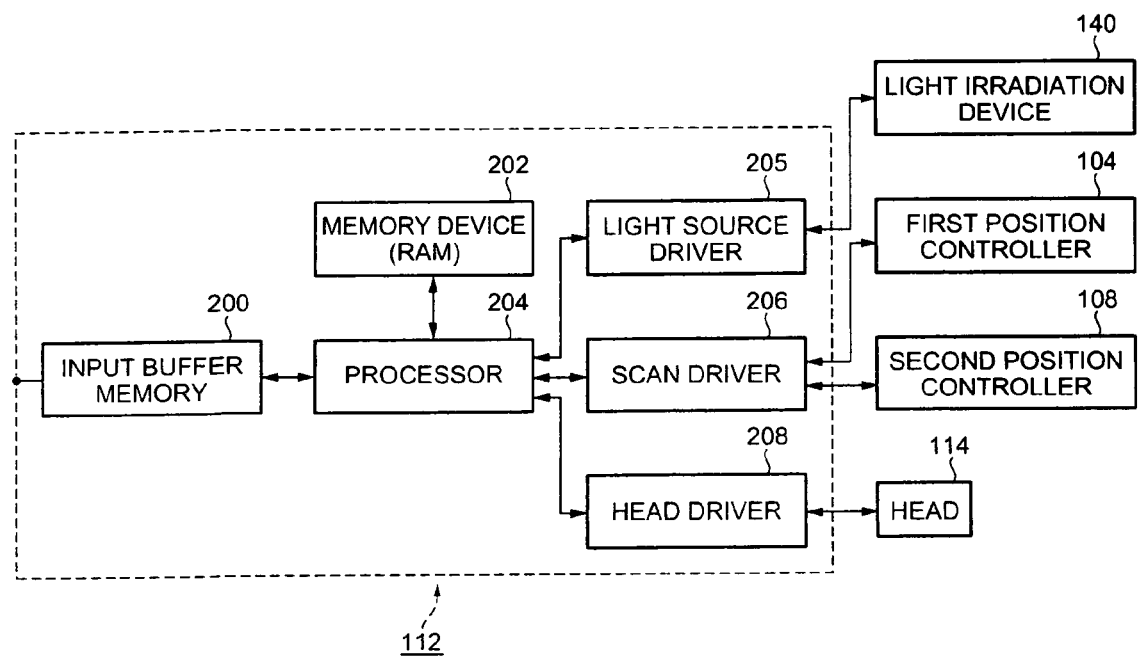
FIG. 3 is a functional block diagram of a controller in the droplet-discharging device.

Next, a configuration of the controller 112 will be described. As shown in FIG. 3, the controller 112 is provided with an input buffer memory 200, a memory device 202, a processor 204, a light source driver 205, a scan driver 206, and a head driver 208. The input buffer memory 200 and the processor 204 are mutually communicatably coupled. The processor 204, the memory device 202, the light source driver 205, the scan driver 206, and the head driver 208 are mutually communicatably coupled to a bus, which is not shown.

The light source driver 205 is communicatably coupled to the light irradiation device 140. Furthermore, the scan driver 206 is mutually communicatably coupled to the first position controller 104 and the second position controller 108. In the same manner, the head driver 208 is mutually communicatably coupled to the head 114.

The input buffer memory 200 receives a discharging data for discharging a droplet of the liquid material 111, from an external information processor (not shown) positioned in the outside of the droplet-discharging device 1. The input buffer memory 200 supplies the processor 204 with the discharging data, and the processor 204 stores the discharging data into the memory device 202. In FIG. 3, the memory device 202 is a RAM.

The processor 204 provides the scan driver 206 with the data indicative of the relative position of the nozzle 118 to the discharged portion, based on the discharging data in the memory device 202. The scan driver 206 provides the first position controller 104 and the second position controller 108 with a stage driving signal in response to this data and a discharging cycle. As a result, the relative position of the discharging-head section 103 with respect to the discharged portion will be varied. On the other hand, the processor 204 provides the head 114 with a discharging signal required for discharging the liquid material 111, based on the discharging data stored in the memory device 202. As a result, the droplet D of the liquid material 111 will be discharged from the corresponding nozzle 118 in the head 114.

Moreover, the processor 204 makes the light irradiation device 140 into one of the states of ON state and OFF state based on the discharging data in the memory device 202. Specifically, the processor 204 supplies the light source driver 205 with each signal indicative of the ON state or the OFF state in order that the light source driver 205 can establish the state of the light irradiation device 140.

The controller 112 is a computer including CPU, ROM, RAM, and a bus. Accordingly, the above-described functions of the controller 112 are realized with a software program executed by the computer. Needless to say, the controller 112 may be realized with a dedicated circuit (hardware).

D. Liquid Material

The above-described "liquid material 111" refers to the material having such a viscosity capable of being discharged as the droplet D from the nozzle 118 of the head 114. Here, it does not matter whether the liquid material 111 is water-based or oil-based. As long as it has such a flowability (viscosity) capable of being discharged from the nozzle 118, that is sufficient, and even if solid materials are mixed therein, just a fluid as a whole may be sufficient. Here, it is preferable that the viscosity of the liquid material 111 be in the range from 1 m Pa·s to 50 m Pa·s. If the viscosity is 1 m Pa·s or more, the periphery of the nozzle 118 will be unlikely contaminated with the liquid material 111 at the time of discharging the droplet D of the liquid material 111. On the other hand, if the viscosity is 50 m Pa·s or less, the frequency of clogging in the nozzle 118 is low, and for this reason, smooth discharging of the droplet D can be realized.

Figure 4A:
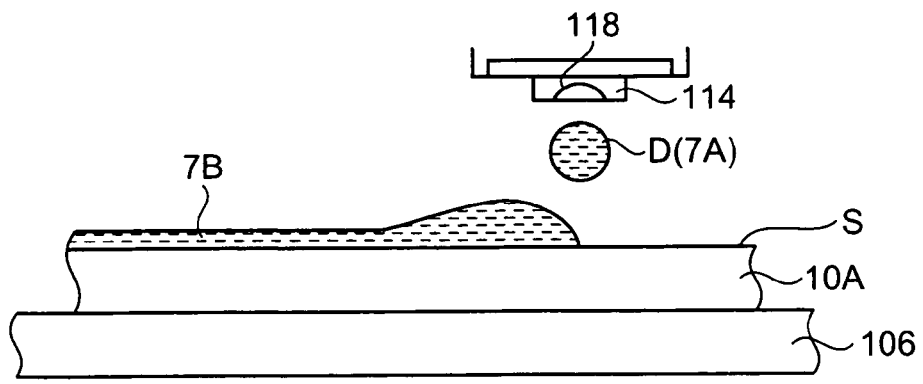
FIG. 4(a)-FIG. 4(d) are views explaining a method for manufacturing a wiring substrate of the embodiment.
Figure 4B:
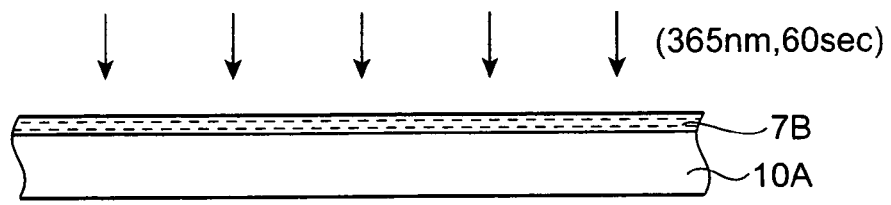
Figure 4C:
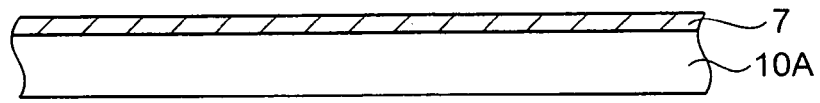
Figure 4D:
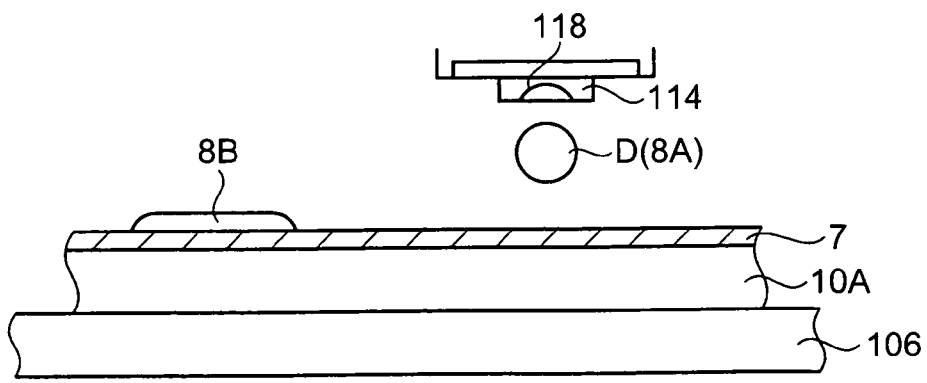

An electric conductive material 8A (FIG. 4(d)) described later is a type of the liquid material 111 described above. The electric conductive material 8A of the embodiment includes silver particles whose mean particle diameter is approximately 10 nm, and a dispersion medium. Then, in the electric conductive material 8A, the silver particles are stably dispersed into the dispersion medium. In addition, the silver particles may be covered with a coating agent. Here, the coating agent is a compound capable of being coordinated with silver atoms.

As such a coating agent, amine, alcohol, thiol and the like are known. More specifically, amine compounds, such as 2-methyl-amino-ethanol, diethanolamine, diethyl-methylamine, 2-dimethyl-amino-ethanol, and methyldiethanolamine; and alkylamines, ethylenediamine, alkyl-alcohols, ethylene-glycol, propylene-glycol, alkyl-thiols, and ethane-dithiol can be used as the coating agent.

The dispersion medium (or solvent) is not restricted, in particular, as long as it can disperse conductive particles such as silver nano particles, and will not cause condensation. Other than water, for example, alcohols, such as methanol, ethanol, propanol, and butanol; hydrocarbon system compounds, such as n-heptane, n-octane, decane, dodecane, tetradecane, toluene, xylene, cymene, durene, indene, dipentene, tetrahydronaphthalene, decahydronaphthalene, and cyclohexylbenzene; and ether system compounds, such as ethylene-glycol-dimethyl-ether, ethylene-glycol-diethyl-ether, ethylene-glycol-methyl-ethyl-ether, diethylene-glycol-dimethyl-ether, diethylene-glycol-diethyl-ether, diethylene-glycol-methyl-ethyl-ether, 1,2-dimethoxy-ethane, bis(2-methoxy ethyl)ether, and p-dioxane; furthermore, polar compounds, such as propylene-carbonate, gamma-butyrolactone, N-methyl-2-pyrrolidone, dimethylformamide, dimethyl-sulfoxide, and cyclohexanone can be exemplified. Among these, water, alcohols, a hydrocarbon system compound, and an ether system compound are preferable in terms of the dispersibility of conductive particles, the stability of distributed liquid, and the easiness of application to the droplet-discharging method, and as a more preferable dispersion medium, water and a hydrocarbon system compound can be listed.

In addition, particles whose mean particle diameter is in the range from approximately 1 nm to several 100 nm, are referred to also as "nano particles". According to this notation, the electric conductive material 8A includes the silver nano particles.

Furthermore, the insulating material 7A (FIG. 4) and insulating-material 9A (FIG. 6) described later are also the liquid material 111. The insulating-material 7A and insulating-material 9A include a photosensitive resin. Then, the photosensitive resin of the embodiment includes a photoinitiator and a monomer and/or an oligomer of an acrylic acid. The photosensitive resin of an acrylic system of the embodiment corresponds to the "first photosensitive resin" and the "second photosensitive resin" of the invention. Thus, in the embodiment, "the first photosensitive resin" and "the second photosensitive resin" are identical to each other.

Hereinafter, a method for manufacturing a wiring substrate using the method for forming the multi-layered structure of the embodiment will be described.

E. Manufacturing Method

First, one surface S of the substrate 10A is UV-cleaned. With the UV cleaning, the surface S is not only cleaned, but the surface S will exhibit a suitable lyophilic to the liquid insulating material 7A described later. For this reason, in the embodiment, the surface S of after the UV-cleaning will serve as the discharged portion and the applied portion described above. Moreover, in the embodiment, the surface S is an example of the "material-body surface" of the invention.

Next, as shown in FIG. 4(*a*), the insulating-material layer 7B is formed all over the surface S using the droplet-discharging device 1. Specifically, the substrate 10A is first positioned on the stage 106 of the droplet-discharging device 1. Then, the droplet-discharging device 1 will vary the relative position of the nozzle 118 with respect to the surface S, two-dimensionally (i.e. in the X-axis direction and the Y-axis direction). Then, the droplet-discharging device 1 discharges the droplet D of the liquid insulating-material 7A from the nozzle 118 towards the surface S in a predetermined cycle based on the first discharging data. Then, a plurality of droplets D reaches all over the surface S in a predetermined pitch, and will get wet and spread. Then, when the reached plurality of droplets D have got wet and spread, the insulating-material layer 7B covering the surface S will be obtained. In addition, the volume and number of droplet D of the insulating material 7A to be discharged are established in order that the thickness of the insulating layer 7 (FIG. 4(*c*)) obtained after the curing process described later is set to approximately 10 μm.

Here, the nozzle 118 in the head 114 of the droplet-discharging device 1 will be referred to also as the "first nozzle".

In addition, in the embodiment, the substrate 10A and one or more layers provided on the substrate 10A will be collectively referred to also as a "base 10B".

After forming the insulating-material layer 7B, the obtained insulating-material layer 7B is cured to form the insulating layer 7 as shown in FIG. 4(*b*) and FIG. 4(*c*). Specifically, the light with a first wavelength belonging to an ultraviolet region is irradiated from the light irradiation device 140 to the insulating-material layer 7B for approximately 60 seconds, thereby obtaining the insulating layer 7. In the embodiment, the wavelength of the light irradiated to the insulating-material layer 7B is 365 nm.

Thus, before forming a pattern (FIG. 4(*d*)) of a material layer 8B described later, the insulating-material layer 7B to serve as the base thereof is cured, therefore, disconnection will not occur in the pattern of the electric conductive material layer 8B.

Next, as shown in FIG. 4(*d*), the pattern of electric conductive material layer 8B is formed on the insulating layer 7 using the droplet-discharging device 2. Specifically, the substrate 10A is first positioned on the stage 106 of the droplet-discharging device 2. Accordingly, the droplet-discharging device 2 varies the relative position of the nozzle 118 to the surface of the insulating layer 7 two-dimensionally. Then, the droplet-discharging device 2 discharges the droplet D of the liquid electric conductive material 8A from the nozzle 118 towards the surface of the insulating layer 7 in response to the second discharging data, whenever the nozzle 118 reaches the position corresponding to the pattern of the electric conductive material layer 8B. Accordingly, a plurality of droplets D will reach on the insulating layer 7, and will get wet and spread. Then, when the reached plurality of droplets D have got wet and spread, the pattern of the electric conductive material layer 8B is formed on the insulating layer 7. In addition, the volume and number of droplet D of the electric conductive material 8A to be discharged are established so that the thickness of the electric conductive layer 8 (FIG. 5(*b*)), which is obtained after a heating process described later, is set to approximately 4 μm.

Here, the nozzle 118 in the head 114 of the droplet-discharging device 2 will be referred to also as the "second nozzle".

Figure 5A:
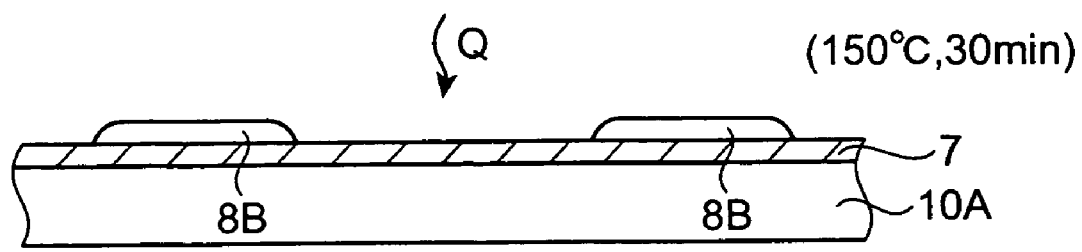
FIG. 5(a) to FIG. 5(c) are views explaining the method for manufacturing a wiring substrate of the embodiment.
Figure 5B:
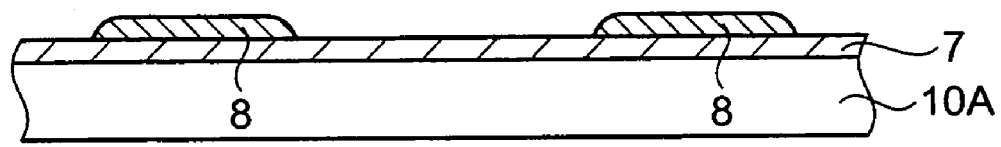

In addition, in the embodiment, as shown in FIG. 5(*a*), the pattern of the electric conductive material layer 8B includes two mutually parallel stripe portions. Each of the two stripe portions is positioned on a part of the insulating layer 7. Moreover, each width of the two stripe portions is approximately 50 μm, and the longitudinal side thereof extends in the direction perpendicular to the space of FIG. 5(*a*).

Next, as shown in FIG. 5(*a*), the pattern of the electric conductive material layer 8B is activated to form a pattern of the electric conductive layer 8 shown in FIG. 5(*b*). Specifically, the pattern of the electric conductive material layer 8B is baked (heated) for 30 minutes at the temperature of 150° C. using a clean heater. Then, silver particles in the electric conductive material layer 8B are sintered or welded, thereby obtaining the pattern of the electric conductive layer 8. Here, the pattern of the electric conductive layer 8 corresponds to the "wiring pattern" of the invention. In addition, in the specification, the pattern of the electric conductive layer 8 will be referred to also as an "electric conduction pattern".

In this manner, in the embodiment, before providing the insulating-material layer 9B covering the insulating layer 7 and the wiring pattern (to be described later), the electric conductive material layer 8B is baked to form the electric conductive layer 8 in advance. Then, a likelihood that the electric conductive layer 8 obtained will deform due to the stress caused by the curing of the insulating-material layer 9B will be lowered. This is because the adhesion force between the insulating layer 7 and the electric conductive layer 8 is stronger than the adhesion force between the insulating layer 7 and the electric conductive material layer 8B (the electric conductive layer 8 before having been activated).

Figure 5C:
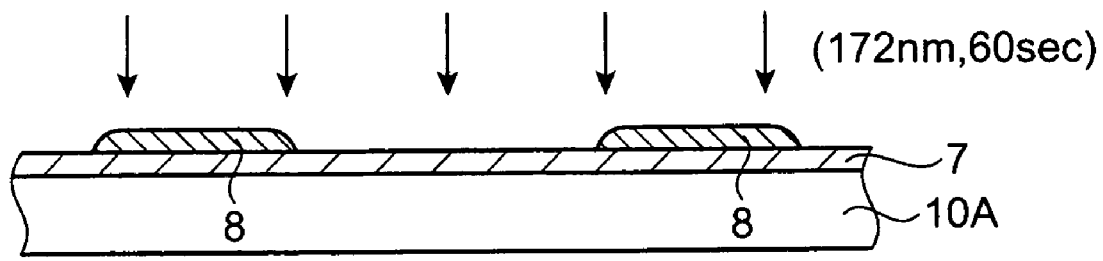

After forming the wiring pattern (the pattern of the electric conductive layer 8), the surface of the insulating layer 7 and the surface of the wiring pattern will be made lyophilic as shown in FIG. 5(c). Specifically, light having a second wavelength different from the first wavelength described above is irradiated uniformly onto the surface of the insulating layer 7 and the surface of an electric conductive layer 8 for approximately 60 seconds. In the embodiment, the second wavelength is 172 nm. Then, the surface of the insulating layer 7 and the surface of the wiring pattern will exhibit lyophilic to a liquid insulating material 9A (FIG. 6(a)) described later. Here, one of the indices indicative of the degree of lyophilic is a "contact angle". In the embodiment, when the droplet D of the insulating material 9A comes in contact with the surface of the insulating layer 7 or the surface of the wiring pattern, which has been made lyophilic, the contact angle made between those surfaces and the droplet D is 20 degrees or less.

The reason for making the surface of the insulating layer 7 and the surface of the wiring pattern lyophilic is as follows. When gone through the curing process for obtaining the insulating layer 7, or the baking (heating) process for obtaining the wiring pattern, these surfaces will exhibit liquid-repellency to the liquid insulating material 9A. Here, if the material-body surface exhibits liquid-repellency, it will be difficult to form a uniform layer over a wide area. On the other hand, in the embodiment, since the surface of the insulating layer 7 and the surface of the wiring pattern are made lyophilic after the baking process, the degree for the droplet of the insulating material 9A to get wet and spread (the degree of lyophilic) will be increased again across the surface of the insulating layer 7 and the surface of the wiring pattern 25. Accordingly, the insulating layer 9 having a flat surface can be formed across these surfaces. Moreover, the thickness of the insulating layer 9 becomes uniform on the insulating layer 7 and on the wiring pattern, respectively.

Figure 6A:
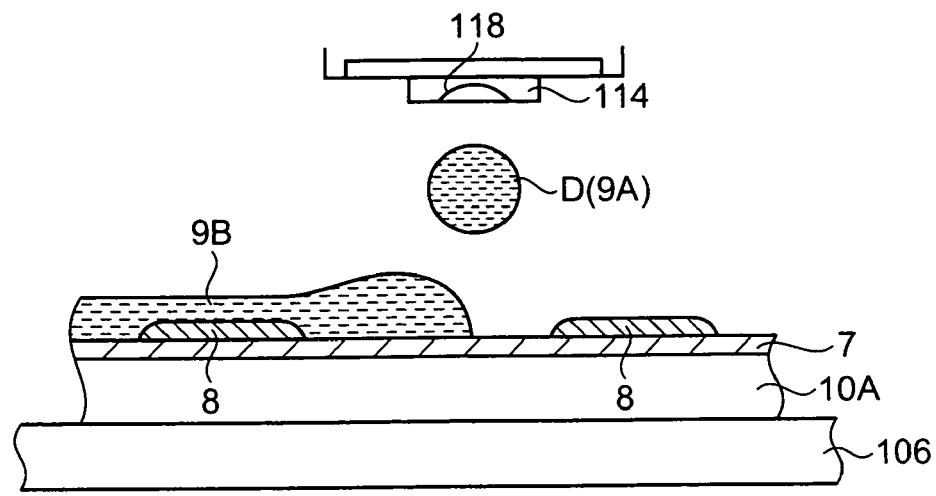
FIG. 6(a) to FIG. 6(d) are views explaining the method for manufacturing a wiring substrate of the embodiment.

After making lyophilic, the insulating-material layer 9B covering the insulating layer 7 and the pattern of the electric conductive layer 8 is formed using the droplet-discharging device 3 as shown in FIG. 6(a). Specifically, the substrate 10A is positioned on the stage 106 of the droplet-discharging device 3. Then, the droplet-discharging device 3 will vary the relative position of the nozzle 118 with respect to the insulating layer 7 and the pattern of the electric conductive layer 8, two-dimensionally. Then, the droplet-discharging device 3 discharges the droplet D of the liquid insulating material 9A from the nozzle 118 towards the insulating layer 7 and the pattern of the electric conductive layer 8 in a predetermined cycle, in response to the third discharging data. Then, a plurality of droplets D reach all over the insulating layer 7 and the pattern of the electric conductive layer 8 in a predetermined pitch, and will get wet and spread. Then, when the reached plurality of droplets D have got wet and spread, the insulating-material layer 9B covering the insulating layer 7 and the pattern of the electric conductive layer 8 will be obtained. In addition, the volume and number of droplet D of the insulating material 9A to be discharged are established so that the thickness of the insulating layer 9 (FIG. 6(c)) obtained after the heating process described later may be set to approximately 10 μm.

Here, the nozzle 118 in the head 114 of the droplet-discharging device 3 will be referred to also as the "third nozzle".

Figure 6B:
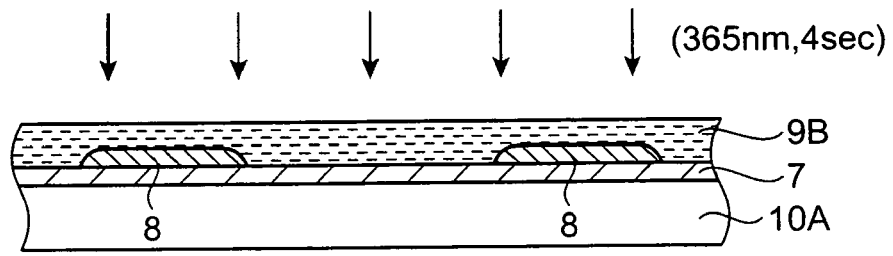

After forming the insulating-material layer 9B, the obtained insulating-material layer 9B is half-cured to form an insulating-material layer 9B' as shown in FIG. 6(b). Specifically, the light with the wavelength of an ultraviolet region is irradiated from the light irradiation device 140 to the insulating-material layer 9B for approximately 4 seconds, thereby obtaining the insulating-material layer 9B' being in a half-cured state. In the embodiment, the wavelength of light to be irradiated to the insulating-material layer 9B is 365 nm.

Here, that the insulating-material layer or the insulating material is half-cured means that the state of the photosensitive resin forming the insulating-material layer becomes in a state of between the state at the time of discharging and the substantially cured state due to the light irradiation. In the embodiment, such an intermediate state is the "half-cured state" described above. In addition, the state at the time of discharging is the state in which the photosensitive resin (the insulating material 7A) is having such a viscosity capable of being discharged from the nozzle 118.

In addition, instead of half-curing the insulating-material layer 9B, time for irradiating light to the insulating-material layer 9B may be increased (for example, 60 seconds), thereby substantially curing the insulating-material layer 9B.

Figure 6C:
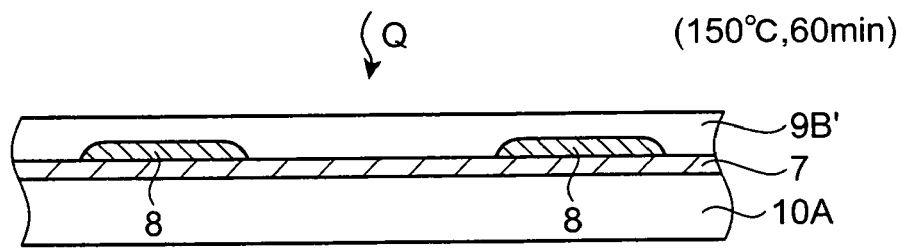

After obtaining the insulating-material layer 9B' being in the half-cured state, the base substance 10B is heated and provided with a quantity of a heat Q as shown in FIG. 6(c). In the embodiment, the base substance 10B is heated for approximately 60 minutes at the temperature of 150 degrees using a clean oven. With this heating, a polymerization reaction of the photosensitive resin in the insulating-material layer 9B' progresses further, and the insulating-material layer 9B' will be cured. As a result, the insulating-material layer 9B' will serve as the insulating layer 9. In addition, even if the insulating-material layer 9B is cured by the light irradiation, it is preferable to carry out such a heating process.

Here, even if monomer or oligomer in which the polymerization reaction has not been completed yet exists in the insulating layer 7 that has been formed earlier, the polymerization reaction in the insulating layer 7 will be completed for certain with the heating process for curing the insulating-material layer 9B'. In a similar manner, since sintering or welding of the silver nano particles in the electric conductive layer 8 will progress completely with this heating process, the electric conduction in the electric conductive layer 8 will be ensured further.

Figure 6D:
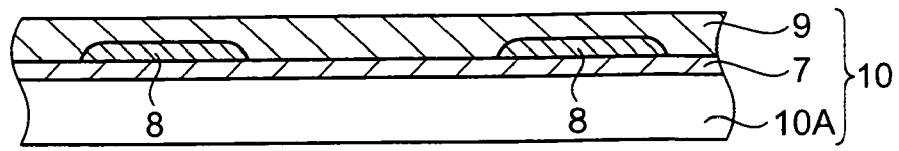

Through the above process, a multi-layered structure including: the insulating layer 7 covering the substrate 10A; the pattern of the electric conductive layer 8 positioned on the insulating layer 7; and the insulating layer 9 covering the insulating layer 7 and the pattern of the electric conductive layer 8 is obtained, as shown in FIG. 6(d). In the embodiment, the insulating layer 7 and the insulating layer 9 are made of an acrylate resin, and the electric conductive layer 8 is a silver wiring. In addition, the substrate 10A in which the electric conductive layer 8 is provided will be referred to also as a "wiring substrate 10".

F. Mounting Process

Figure 7:
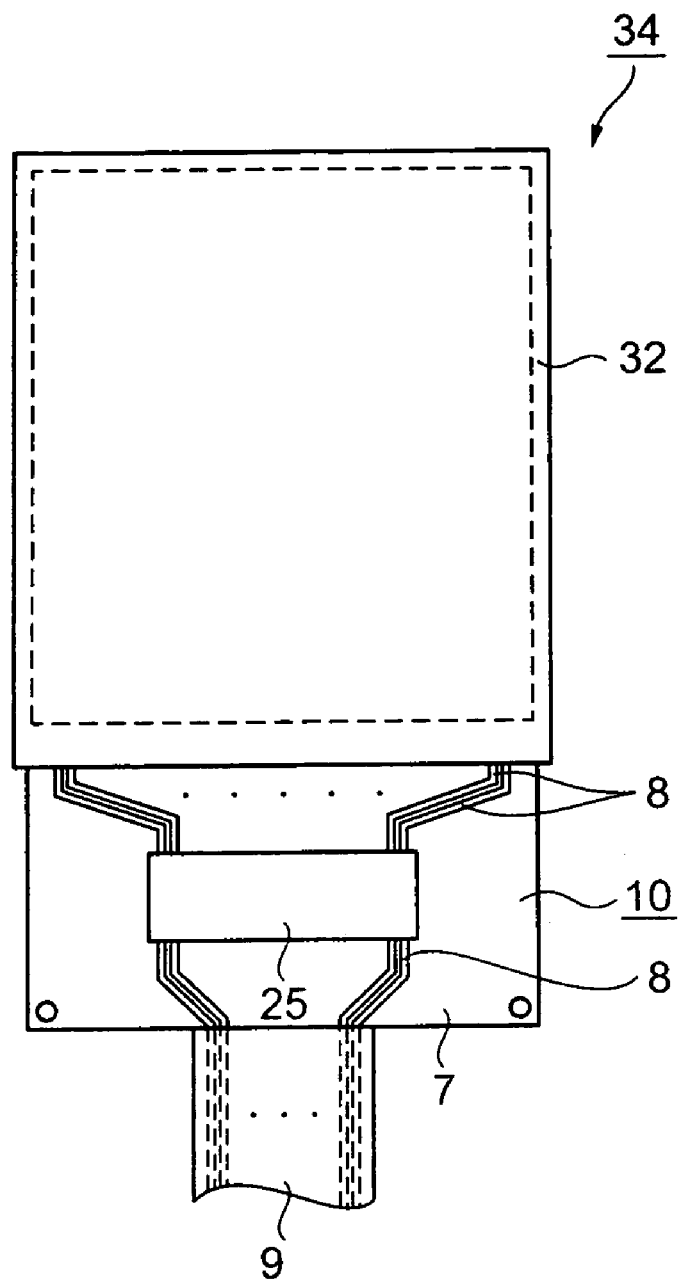
FIG. 7 is a schematic view of a liquid crystal display device of the embodiment.

Next, as shown in FIG. 7, a liquid crystal panel 32 and a semiconductor device 25 are mounted in the wiring substrate 10. Specifically, a portion in which the pattern of the electric conductive layer 8 is not covered with the insulating layer 9 is formed in a part of the wiring substrate 10. Then, a pad for the liquid crystal panel or a corresponding pad for the semiconductor device 25 is bonded to the exposed pattern of the electric conductive layer 8. Thus, a liquid crystal display device 34 is obtained. In this way, the manufacturing method of the embodiment can be applied to the manufacturing of the liquid crystal display device 34. In addition, in the embodiment, the semiconductor device 25 is a liquid crystal driver circuit.

Furthermore, the manufacturing method of the embodiment is applied not only to the manufacturing of the liquid crystal display device but also to the manufacturing of various electro-optic device. The "electro-optics device" described here is not restricted to the devices using the changes of optical characteristics (the so-called electro-optic effects), such as the changes of birefringence, the changes of rotatory polarization, and the changes of light-scattering characteristic, but means devices in general which emit, transmit or reflect light in response to the application of signal voltages.

Specifically, the electro-optics device is a term including a liquid crystal display device, an electroluminescence display device, a plasma display device, a display using a surface-conduction type electron emission element (SED: Surface-Conduction Electron-Emitter Display), a field emission display (FED: Field Emission Display), and the like.

Figure 8:
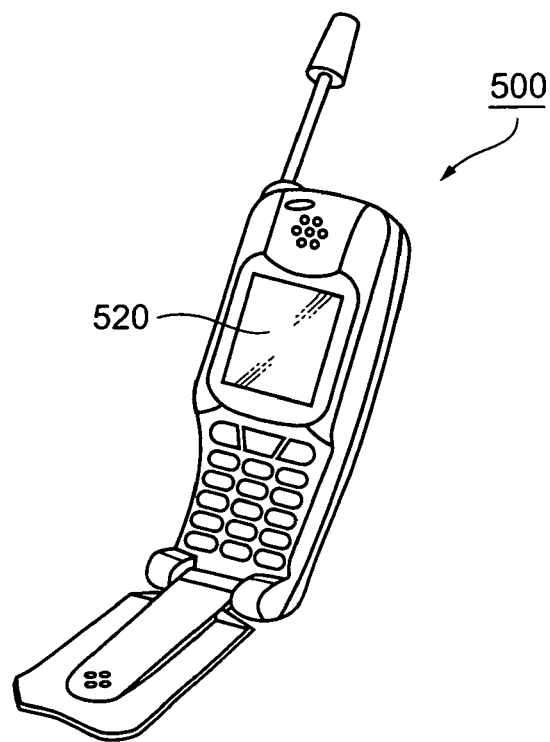
FIG. 8 is a schematic view showing a portable telephone of the embodiment.
Figure 9:
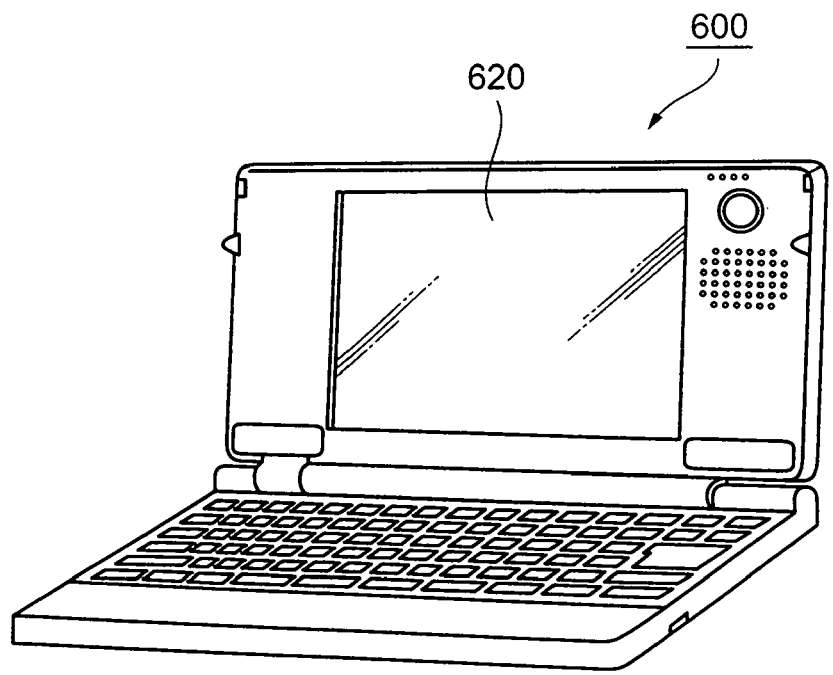
FIG. 9 is a schematic view showing a personal computer of the embodiment.

Furthermore, the method for forming a multi-layered structure of the embodiment may be applied to the manufacturing methods of various electronic apparatus. For example, the manufacturing method of the embodiment is applied also to the manufacturing method of a portable telephone 500 provided with an electro-optics device 520 as shown in FIG. 8, and the manufacturing method of a personal computer 600 provided with an electro-optics device 620 as shown in FIG. 9.

(Modification 1)

According to the embodiment described above, three different droplet-discharging devices 1, 2, and 3 discharge the insulating material 7A, the electric conductive material 8A, and the insulating material 9A, respectively. In place of such configuration, one droplet-discharging device (for example, the droplet-discharging device 1) may discharge all the insulating material 7A, electric conductive material 8A, and insulating material 9A described above. In this case, these insulating material 7A, electric conductive material 8A, and insulating material 9A may be discharged from each separate nozzle 118 in the droplet-discharging device 1, or may be discharged from one nozzle 118 in the droplet-discharging device 1. In the case where these three liquid materials are discharged from one nozzle 118, a process to clean the passage from the tank 101 to the nozzle 118 at the time of changing the liquid material just needs to be added.

Here, in the case where these three liquid materials are discharged from one nozzle, the above-described "first nozzle", "second nozzle" and "third nozzle" correspond to one identical nozzle 118.

(Modification 2)

In the embodiment described above, the multi-layered structure is provided on the substrate 10A composed of polyimide. However, even if a ceramic substrate, a glass substrate, an epoxy substrate, a glass epoxysubstrate, a silicon substrate, or the like is used in place of such a substrate 10A, the same advantages as those described in the above embodiment are obtained.

(Modification 3)

The silver nano particles are included in the electric conductive material 8A of the embodiment described above. However, in place of the silver nano particles, nano particles of other metals may be used. Here, as the other metals, for example, any one of gold, platinum, copper, palladium, rhodium, osmium, ruthenium, iridium, iron, tin, zinc, cobalt, nickel, chromium, titanium, tantalum, tungsten, and indium may be used, or an alloy of combining any two or more of these may be used. However, in case of silver, it can be reduced at relatively low temperature, and it is therefore easy to be handled. For this reason, in the case where the droplet-discharging device is used, it is preferable to use the electric conductive material 8A including silver nano particles.

Moreover, the electric conductive material 8A may include an organometallic compound in place of the metal nano particles. The organometallic compound described here is a compound from which a metal is separated due to the decomposition by heating. Such organometallic compound includes a chloro-triethyl-phosphine gold (I), a chloro-trimethyl-phosphine gold (I), a chloro-triphenyl-phosphine gold (I), silver (I) 2,4-pentane-dionat complex, a trimethyl-phosphine (hexa-fluoro-acetyl-acetonato) a silver (I) complex, copper (I) a hexa-fluoro-pentane-dionat-cycloocta-diene complex and the like.

In this way, the form of the metal included in the liquid electric conductive material 8A may be a form of particles represented by nano particles, or may be a form of a compound like the organometallic compound.

Furthermore, the electric conductive material 8A may include soluble materials of a high polymer system, such as polyaniline, polythiophene, and polyphenylene-vinylene in place of metal.

(Modification 4)

In the embodiment described above, the insulating layer 7 and the insulating layer 9 are composed of the mutually identical material. However, the insulating layer 7 and the insulating layer 9 may be composed of mutually different materials. For example, the insulating layer 7 may be composed of an acrylate resin and the insulating layer 9 may be composed of a polyimide resin. In this case, the insulating material 7A just needs to be a liquid material including a monomer or an oligomer of a photosensitive acrylate resin, and the insulating material 9A just needs to be a liquid material including a photosensitive polyimide precursor. That is, in this case, the "first photosensitive resin" and the "second photosensitive resin" of the invention differ from each other.

(Modification 5)

According to the embodiment described above, the pattern of the electric conductive layer 8 is formed on the insulating layer 7. However, the method for forming the multi-layered structure of the embodiment described above is not restricted to the formation of such structure. Specifically, the pattern of the electric conductive layer 8 on the insulating layer 7 may be omitted. Then, in order that the summation of the thicknesses of the plurality of multi-layered insulating layers may be set to a desired value, the steps of forming an insulating material layer using the droplet-discharging device; curing the formed insulating-material layer, thereby obtaining an insulating layer; making the surface of the insulating layer lyophilic; forming an insulating-material layer again on the insulating layer, which has been made lyophilic, using a droplet-discharging device may be repeated.

The total drying time will be shorter and the final thickness of the insulating layer can be made uniform more easily in forming the insulating layer having a desired thickness by repeating the steps of forming an insulating-material layer, making lyophilic, and curing, rather than in obtaining the insulating layer having the desired thickness, by one curing step, from the insulating-material layer formed by discharging.

(Modification 6)

According to the embodiment described above, the light with the wavelength of an ultraviolet region is irradiated, thereby making the surface of the insulating layer 7 and the surface of the wiring pattern lyophilic. However, in place of such making lyophilic, it is also possible to make the surface of the insulating layer 7 and the surface of the wiring pattern lyophilic by applying an $O_2$ plasma treatment in which the oxygen serves as the treating gas in air atmosphere. The $O_2$ plasma treatment is a process to irradiate oxygen being in a plasma state from a plasma discharging electrode, which is not shown, to the substrate 10A (the base substance 10B). The conditions of the $O_2$ plasma treatment may be as follows: a plasma power of 50 through 1000 W, the oxygen gas flow volume of 50 through 100 mL/min, the relative-move velocity of the base substance 10 relative to the plasma discharging electrode of 0.5 through 10 mm/sec, and the temperature of the base substance of 70 through 90° C.

What is claimed is:

1. A method for forming a multi-layered structure using a droplet-discharging device, comprising:
    forming a first insulating-material layer, which covers a material-body surface, by discharging a droplet of a first insulating material including a first photosensitive resin to the material-body surface;
    obtaining a first insulating layer by curing in the first insulating-material layer, the curing the first insulating-material including irradiating the first insulating-material layer with ultraviolet light with a first wavelength;
    making the surface of the first insulating layer lyophilic, the making the surface of the first insulating layer lyophilic including irradiating the surface of the first insulating layer with ultraviolet light with a second wavelength different from the first wavelength;
    forming a pattern of an electric conductive material layer on the first insulating layer by discharging a droplet of an electric conductive material to the first insulating layer; and
    forming a wiring pattern on the first insulating layer by activating the pattern of the electric conductive material layer;
    forming a second insulating-material layer, which covers the first insulating layer and the electric conductive material layer, by discharging a droplet of a second insulating material including a second photosensitive resin to the first insulating layer and the electric conductive material layer, a contact angle formed between the first insulating layer and the second insulating material being 20 degrees or less; and
    curing the second insulating-material layer.

2. A method for manufacturing a wiring substrate, comprising the method for forming a multi-layered structure according to claim 1.

3. A method for manufacturing an electronic apparatus, comprising the method for forming a multi-layered structure according to claim 1.

4. The method according to claim 1, wherein the first wavelength is 365 nm and the second wavelength is 172 nm.

5. The method according to claim 1, wherein the step of making the surface of the first insulating layer lyophilic further comprises making a surface of the wiring pattern lyophilic by irradiating the surface of the wiring pattern with ultraviolet light.

6. The method according to claim 1, wherein the step of making the surface of the first insulating layer lyophilic is performed after the step of forming the wiring pattern on the first insulating layer by activating the pattern of the electric conductive material layer.

7. A method for forming a multi-layered structure using a droplet-discharging device, comprising:
    forming a first insulating-material layer covering a material-body surface by discharging a droplet of a first insulating material including a first photosensitive resin to the material-body surface;
    obtaining the first insulating layer by curing the first insulating-material layer, the curing the first insulating-material including irradiating the first insulating-material layer with ultraviolet light with a first wavelength;
    making the surface of the first insulating layer lyophilic, the making the surface of the first insulating layer lyophilic including irradiating the surface of the first insulating layer with ultraviolet light with a second wavelength different from the first wavelength;
    forming a second insulating-material layer covering the first insulating layer by discharging a droplet of a second insulating material including a second photosensitive resin to the first insulating layer, a contact angle formed between the first insulating layer and the second insulating material being 20 degrees or less; and
    curing the second insulating-material layer.

8. The method according to claim 7, wherein the first wavelength is 365 nm and the second wavelength is 172 nm.

* * * * *